(12) United States Patent
Rangarajan et al.

(10) Patent No.: US 6,441,349 B1
(45) Date of Patent: Aug. 27, 2002

(54) SYSTEM FOR FACILITATING UNIFORM HEATING TEMPERATURE OF PHOTORESIST

(75) Inventors: Bharath Rangarajan, Santa Clara; Bhanwar Singh, Morgan Hill; Sanjay K. Yedur, Santa Clara, all of CA (US)

(73) Assignee: Advanced Micro Devices, Sunnyvale, CA (US)

(*) Notice: Subject to any disclaimer, the term of this patent is extended or adjusted under 35 U.S.C. 154(b) by 0 days.

(21) Appl. No.: 09/558,643

(22) Filed: Apr. 26, 2000

(51) Int. Cl.[7] ................................................. H05B 3/68
(52) U.S. Cl. ..................................... 219/444.1; 396/576
(58) Field of Search ......................... 165/80.1, 80.4, 165/1; 361/234; 62/3.7; 385/16; 219/444.1, 390; 347/62; 430/330; 118/728; 324/760; 396/576; 438/702; 216/27

(56) References Cited

U.S. PATENT DOCUMENTS

| | | | |
|---|---|---|---|
| 4,274,476 A | * 6/1981 | Garrett | 165/80.4 |
| 4,518,848 A | 5/1985 | Weber | 219/388 |
| 4,778,559 A | * 10/1988 | McNeill | 118/728 |
| 4,859,572 A | 8/1989 | Farid et al. | 430/281 |
| 5,025,133 A | * 6/1991 | Tsutahara et al. | 219/444.1 |
| 5,034,688 A | * 7/1991 | Moulene et al. | 324/760 |
| 5,167,078 A | 12/1992 | Bolde et al. | 34/23 |
| 5,228,501 A | * 7/1993 | Tepman et al. | 165/80.1 |
| 5,484,011 A | * 1/1996 | Tepman et al. | 165/1 |
| 5,716,763 A | 2/1998 | Benoit et al. | 430/330 |
| 5,730,889 A | * 3/1998 | Miyagawa et al. | 216/27 |
| 5,754,391 A | * 5/1998 | Bates | 361/234 |
| 5,802,856 A | * 9/1998 | Schaper et al. | 62/3.7 |
| 5,825,043 A | 10/1998 | Suwa | 250/548 |
| 5,986,875 A | * 11/1999 | Donde et al. | 361/234 |
| 6,034,771 A | 3/2000 | Rangarajan et al. | 356/345 |
| 6,055,344 A | * 4/2000 | Fouquet et al. | 385/16 |
| 6,096,656 A | * 8/2000 | Matzke et al. | 438/702 |
| 6,107,608 A | * 8/2000 | Hayes | 219/444.1 |
| 6,139,130 A | * 10/2000 | Takahashi et al. | 347/62 |
| 6,143,478 A | * 11/2000 | Toshima et al. | 430/330 |
| 6,250,822 B1 | * 6/2001 | Wakamiya et al. | 396/576 |
| 6,313,441 B1 | * 11/2001 | Schaper et al. | 219/390 |

* cited by examiner

*Primary Examiner*—Teresa Walberg
*Assistant Examiner*—L Fastovsky

(57) ABSTRACT

A system and method for facilitating uniform heating temperature of a material is provided. The material may be a photoresist, a top or bottom anti-reflective coating, a low K dielectric material, SOG or other spin-on material. The system can include at least one heating element and a heat transfer fluid, the heating element heating the heat transfer fluid, which in turn heats the material. The transfer fluid more evenly distributes the heat from the heating element, which can have hot and cold spots at the material.

42 Claims, 17 Drawing Sheets

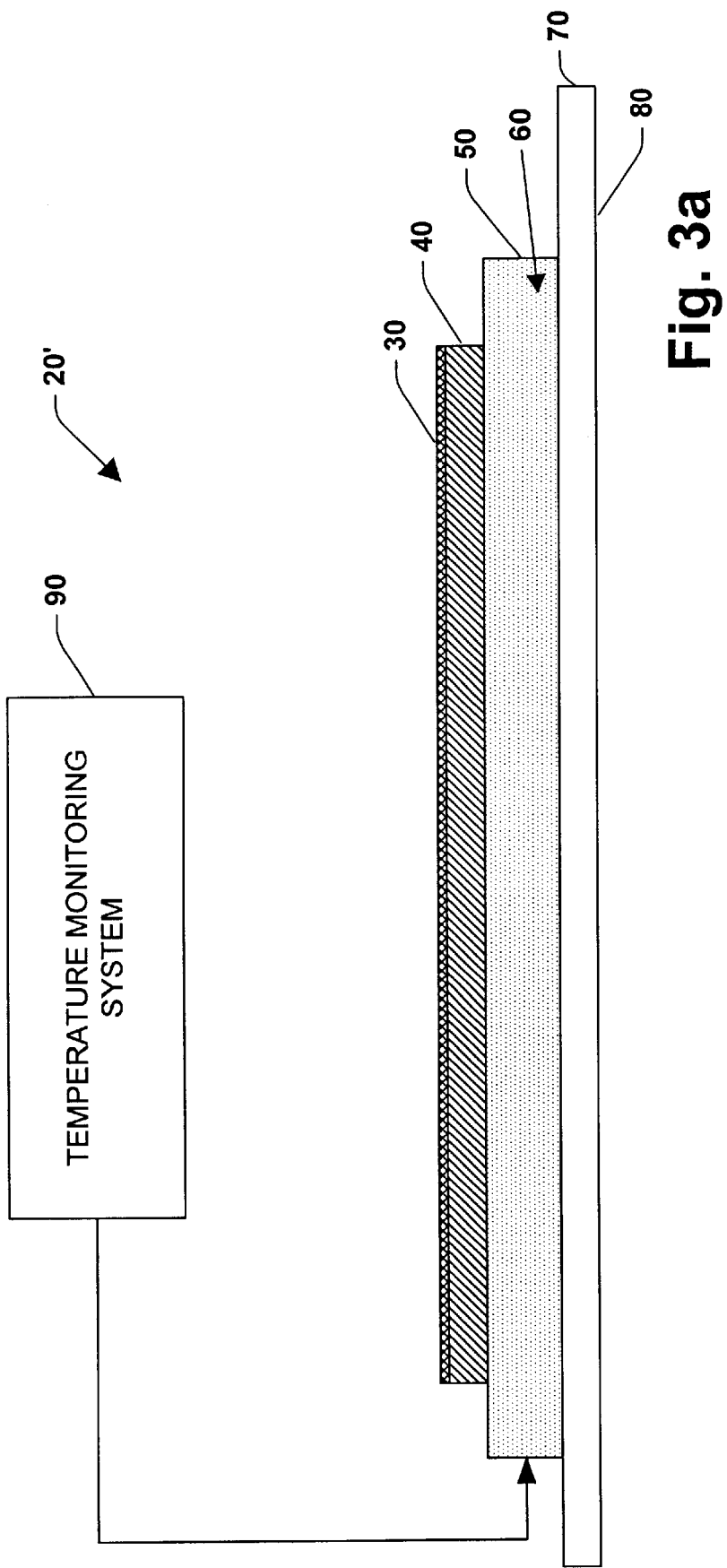

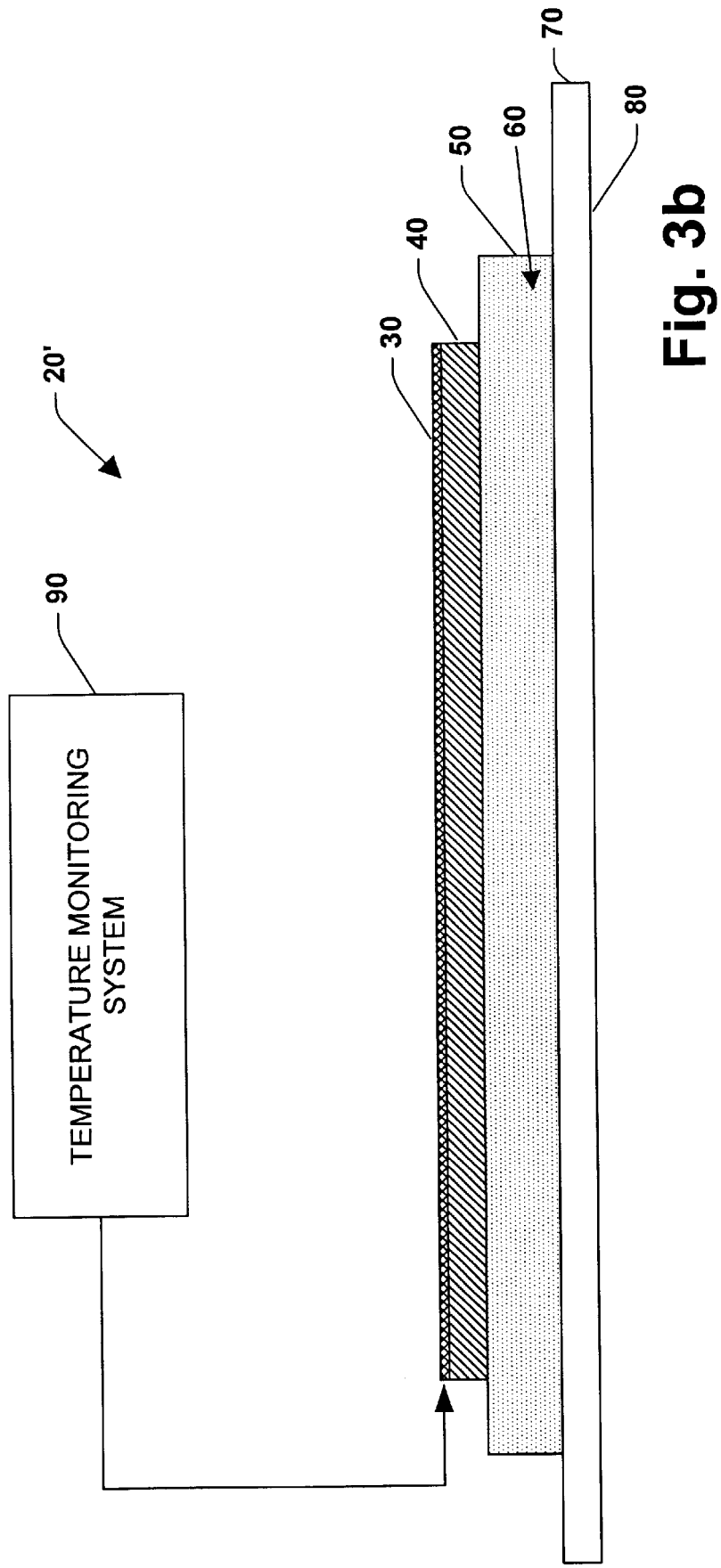

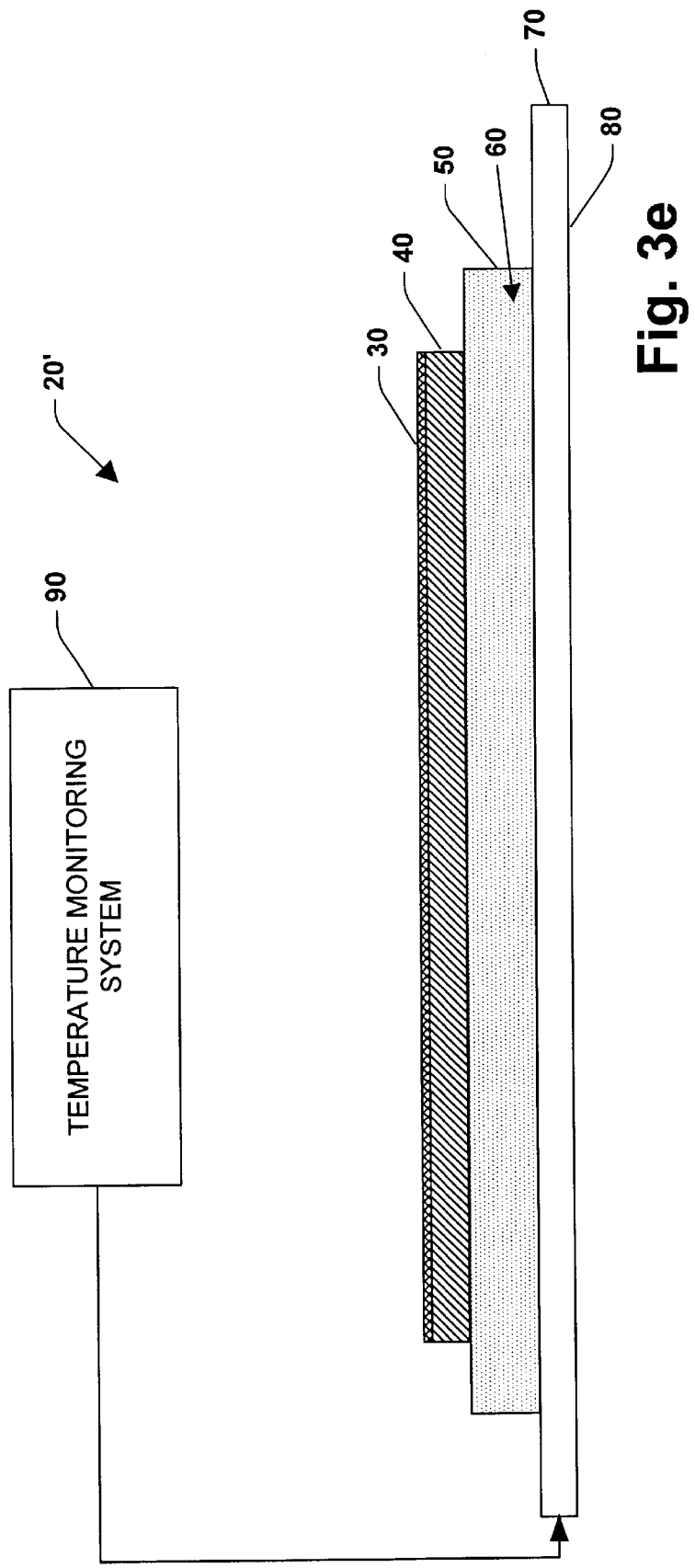

SYSTEM FOR FACILITATING UNIFORM HEATING TEMPERATURE OF PHOTORESIST

TECHNICAL FIELD

The present invention generally relates to semiconductor processing, and in particular to a system for facilitating a uniform heating temperature of a photoresist.

BACKGROUND OF THE INVENTION

In the semiconductor industry, there is a continuing trend toward higher device densities. To achieve these high densities there has been and continues to be efforts toward scaling down the device dimensions (e.g., at submicron levels) on semiconductor wafers. In order to accomplish such high device packing density, smaller and smaller features sizes are required. This may include the width and spacing of interconnecting lines, spacing and diameter of contact holes, and the surface geometry such as corners and edges of various features.

The requirement of small features with close spacing between adjacent features requires high resolution photolithographic processes. In general, lithography refers to processes for pattern transfer between various media. It is a technique used for integrated circuit fabrication in which a silicon slice, the wafer, is coated uniformly with a radiation-sensitive film, the resist, and an exposing source (such as optical light, x-rays, or an electron beam) is used to illuminate selected areas of the surface through an intervening master template, the mask, for a particular pattern. The lithographic coating is generally a radiation-sensitive coating suitable for receiving a projected image of the subject pattern. Once the image is projected, it is indelibly formed in the coating. The projected image may be either a negative or a positive image of the subject pattern. Exposure of the coating through a photomask causes the image area to become either more or less soluble (depending on the coating) in a particular solvent developer. The more soluble areas are removed in the developing process to leave the pattern image in the coating as less soluble polymer.

Due to the extremely fine patterns which are exposed on the photoresist, application and heating of the photoresist are significant factors in achieving desired critical dimensions. The photoresist should be heated such that a uniform heating rate is maintained in order to ensure uniformity and quality of the photoresist layer. The photoresist layer thickness typically is in the range of 0.1 to 3.0 microns. Good resist thickness control is highly desired, and typically variances in thickness should be less than ±10–20 Å across the wafer. Very slight variations in the photoresist thickness may greatly affect the end result after the photoresist is exposed by radiation and the exposed portions removed.

One of the variables in heating of photoresist film is the temperature at which heating occurs. In order to achieve uniform heating, a uniform temperature in a curing or enclosure chamber is necessary. Small changes in the time/temperature history of the photoresist can substantially alter image sizes, resulting in lack of image line control. A uniform time/temperature history of the photoresist is especially important with chemically amplified photoresists because image size control may be drastically affected by only a few degrees difference in temperature. Often substantial line size deviations occur when the temperature is not maintained within 0.5 degree tolerance across a silicon wafer. For example, when a photoresist is baked onto a substrate (e.g., wafer), temperature tolerances of ±0.2° C. are required.

An efficient system/method to uniformly heat a layer of temperature-sensitive film formed on a semiconductor substrate is therefore desired to increase fidelity in image transfer.

SUMMARY OF THE INVENTION

The present invention provides for a system and method that facilitates uniform heating of photoresist formed on a semiconductor substrate (e.g., wafer). One aspect of the invention employs a heat transfer fluid to enhance the uniform heating of the photoresist. Heating elements are used to heat the heat transfer fluid, which in turn heats the wafer. The heat transfer fluid distributes the heat generated by the heating elements more evenly than conventional techniques, so as to eliminate hot and cold spots. The result is increased uniformity in heating of the wafer, and, thus increased uniformity in heating of the photoresist on the wafer. As a result of achieving substantial uniformity in heating of the photoresist, the fidelity of image transfer is increased.

One particular aspect of the invention relates to a system for facilitating a uniform photoresist heating temperature. At least one heating element operates to heat a heat transfer fluid. The heat transfer fluid is coupled to a substrate so as to heat a photoresist thereon. The heat transfer fluid can be any fluid suitable for transferring heat to the photoresist, such as a gas or a liquid. The system can include a shell for containing the heat transfer fluid. At least one heating element can be coupled to the shell, and the shell can be coupled to the substrate.

In another aspect of the invention, the system can include at least one temperature monitoring system for monitoring a temperature. At least one temperature monitoring system can provide temperature information of the heat transfer fluid. Alternatively, the at least one temperature monitoring system can provide temperature information of the photoresist. One temperature monitoring system can provide temperature information on the heat transfer fluid, and another temperature monitoring system can provide temperature information on the photoresist.

In yet another aspect of the invention, the temperature regulating system can include at least one temperature measuring system for measuring a temperature. At least one temperature regulating system can include at least one processor operatively coupled to at least one heating element. The processor can receive temperature data from the temperature measuring system. The processor can use the data to regulate the temperature of at least one heating element. At least one temperature measuring system can measure the temperature of the photoresist. Alternatively, at least one temperature measuring system can measure the temperature of the heat transfer fluid. At least one temperature regulating system can further include at least one temperature measuring system for measuring the temperature of the photoresist, and at least one temperature measuring system for measuring the temperature of the heat transfer fluid. The temperature measuring system can be any system suitable for measuring a temperature. At least one temperature regulating system can determine the existence of an unacceptable temperature based upon the determined temperature differing from an acceptable value.

Still another aspect of the invention relates to a system for facilitating uniform heating of a photoresist covering a substrate. The system comprises a plate for supporting the substrate. The plate comprises a surface for engaging a shell containing a heat transfer fluid, and at least one heating element operatively coupled to the plate for regulating temperature of at least portions of the photoresist, respectively, via heat conduction through the plate, shell, and substrate. The system further comprises a temperature regulating system for regulating temperature of at least a portion of the photoresist. The temperature regulating system comprises a temperature measuring system and a processor operatively coupled to the temperature measuring system and the at least one heating element.

In another aspect, the present invention can include a memory that stores acceptable temperature values for the photoresist. The processor can determine the existence of an unacceptable temperature for at least a portion of the photoresist based upon the measured temperature differing from an acceptable value. The processor can control at least one heating element to regulate the temperature of the photoresist portion.

Still yet another aspect of the invention relates to a method for facilitating uniform photoresist heating temperature. The method includes heating a heat transfer fluid to a temperature, and coupling a substrate with the heat transfer fluid so as to heat a photoresist to a temperature. The heat transfer fluid can be any fluid suitable for transferring heat to the photoresist. The heat transfer fluid can be contained in a shell, and the shell can be coupled to the substrate. The heat transfer fluid can be heated by at least one heating element coupled to the shell. At least one heating element can be inside the shell. At least one heating element can be outside the shell. The method can include regulating the temperature of the photoresist. The method can include regulating the temperature of the heat transfer fluid. Furthermore, the method can include regulating the temperature of the heat transfer fluid, and regulating the temperature of the photoresist. Alternatively, the method can include regulating the temperature of the at least one heating element.

Another aspect of the invention relates to a system for facilitating uniform heating of a photoresist. The system can include means for heating a heat transfer fluid to a temperature, and means for coupling the heat transfer fluid to a substrate so as to heat a photoresist to a temperature. The system can also include means for regulating the temperature of the photoresist. The system can further include means for regulating the temperature of the heat transfer fluid. Furthermore, the system can include both means for regulating the temperature of the photoresist, and means for regulating the temperature of the heat transfer fluid.

Still yet another aspect of the invention relates to a system for facilitating uniform heating temperature of a material. The system can include at least one heating element operative to heat a heat transfer fluid. The heat transfer fluid can be coupled to the material. The material can be a variety of materials including a top anti-reflective coating, a bottom anti-reflective coating, a low K dielectric material, spin on glass, a spin-on material.

To the accomplishment of the foregoing and related ends, the invention, then, comprises the features hereinafter fully described and particularly pointed out in the claims. The following description and the annexed drawings set forth in detail certain illustrative embodiments of the invention. These embodiments are indicative, however, of but a few of the various ways in which the principles of the invention may be employed. Other objects, advantages and novel features of the invention will become apparent from the following detailed description of the invention when considered in conjunction with the drawings.

BRIEF DESCRIPTION OF THE DRAWINGS

FIG. 3a is a schematic block diagram of a temperature monitoring system in accordance with the present invention;

FIG. 3b is a schematic block diagram of the temperature monitoring system coupled to the photoresist layer in accordance with the present invention;

FIG. 3e is a schematic block diagram of the temperature monitoring system coupled to the bake plate in accordance with the present invention;

DETAILED DESCRIPTION OF THE INVENTION

Figure 1A:
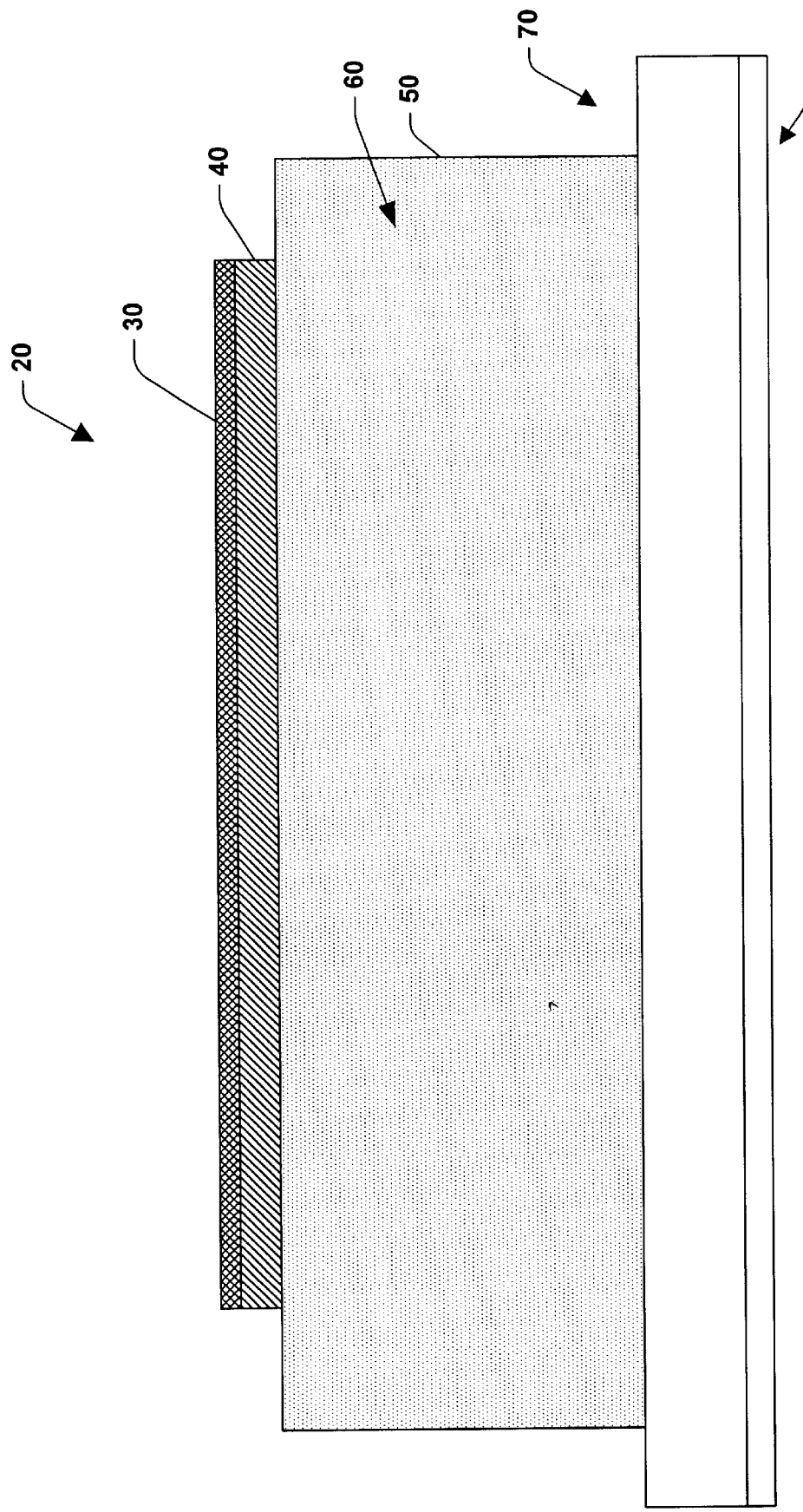
FIG. 1a is a schematic block diagram of a photoresist heating system in accordance with the present invention.

The present invention will now be described with reference to the drawings, wherein like reference numerals are used to refer to like elements throughout. The present invention will be described with reference to a system and method for facilitating uniform heating of a photoresist disposed on a wafer using a heat transfer fluid. It should be understood that the description of these embodiments are merely illustrative and that they should not be taken in a limiting sense.

Referring initially to FIG. 1a, a system 20 for heating substantially uniformly a photoresist 30 is shown. It is to be appreciated that the present invention may be applied to pre-baking as well as post exposure baking of the photoresist. Furthermore, although the present invention is primarily described within the context of heating a photoresist, it is to be understood that the present invention may be applied to the heating of top and bottom anti-reflective coatings, low K dielectric materials, spin-on-glass (SOG), and other spin-on materials.

A substrate 40, having the photoresist 30 thereon, is supported over a shell 50 containing a heat transfer fluid 60. The baking plate 70 supports the shell 50. The baking plate 70 includes heating elements 80, which generate heat. The baking plate 70 is thermally conductive so as to transfer heat by conduction to and from the shell 50 and the heat transfer fluid 60 within. The shell 50 is thermally conductive so as to transfer heat by conduction to and from the shell 50 and the heat transfer fluid 60. The shell 50 and the heat transfer fluid 60 transfer heat to the substrate 40, which in turn effects heating of the photoresist 30. The heat transfer fluid 60 more evenly distributes the heat generated by the heating elements 80, so as to eliminate hot and cold spots, and resulting in a more even heating of the photoresist 30. As a result, substantial uniformity in heating of the photoresist 30 is achieved, which in turn increases fidelity of image transfer.

Figure 1B:
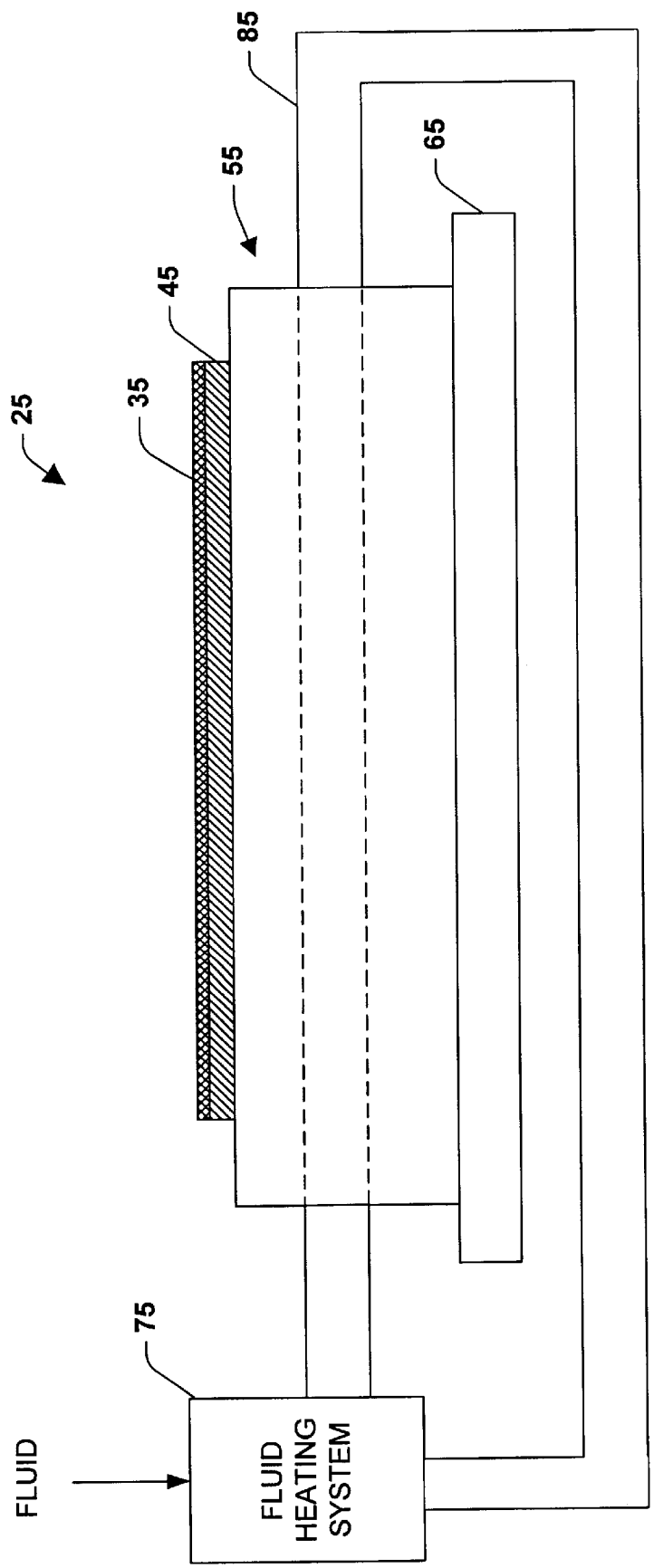
FIG. 1b is a schematic block diagram of an alternate photoresist heating system in accordance with the present invention.

Referring to FIG. 1b, an alternate system 25 is provided for heating substantially uniformly a photoresist 35 is shown. A substrate 45, having the photoresist 30 thereon, is supported over a shell 55 containing a heat transfer fluid within a distribution line 85. A base plate 65 supports the shell 55. A fluid is provided to a fluid heating system 75, which heats and distributes the fluid through the distribution line 85 through the shell 55. The distribution line 85 and the shell 55 are thermally conductive so as to transfer heat by conduction to and from the shell 55 and the heat transfer fluid. The shell 55 and the heat transfer fluid transfer heat to the substrate 45, which in turn effects heating of the photoresist 35.

Figure 2A:
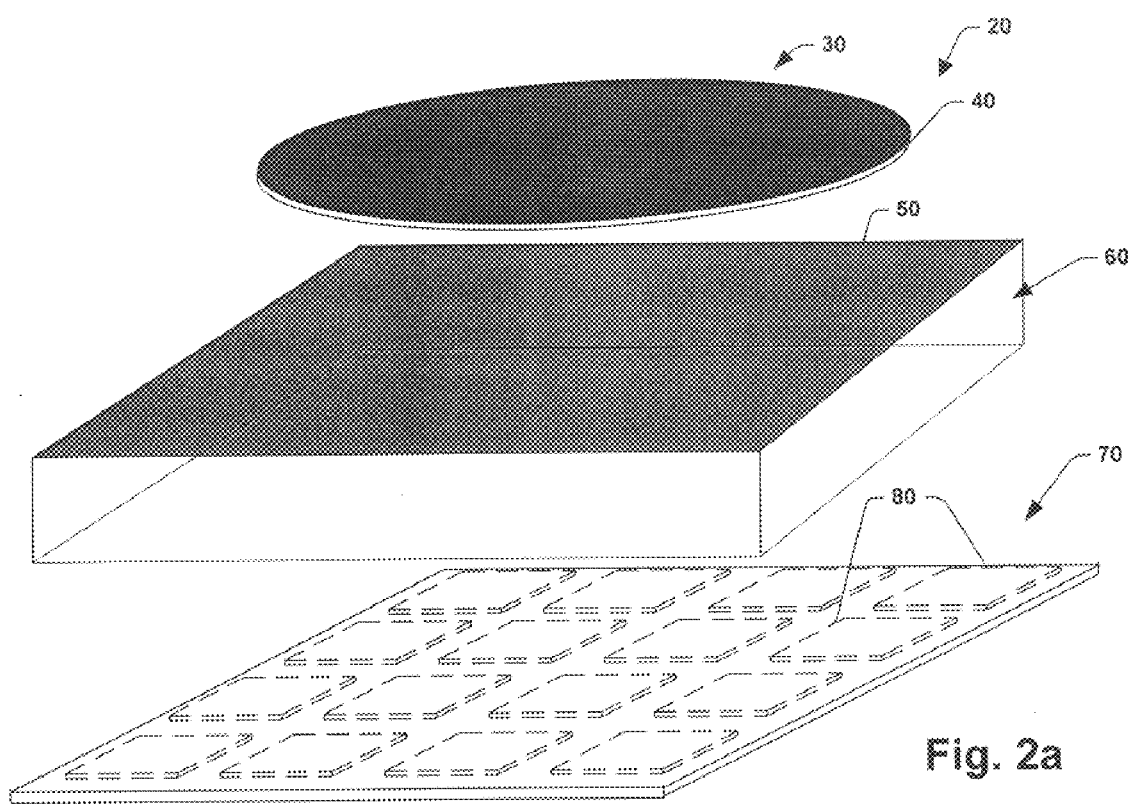
FIG. 2a is an exploded perspective illustration of a photoresist heating system in accordance with the present invention.
Figure 2B:
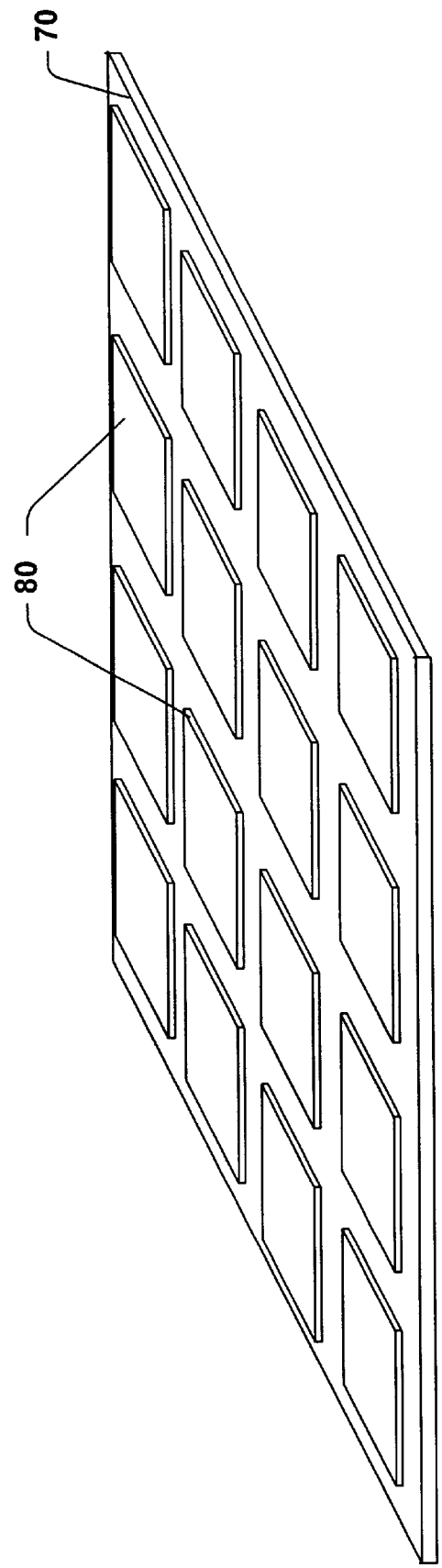
FIG. 2b is a perspective illustration of a baking plate in accordance with the present invention.
Figure 2C:
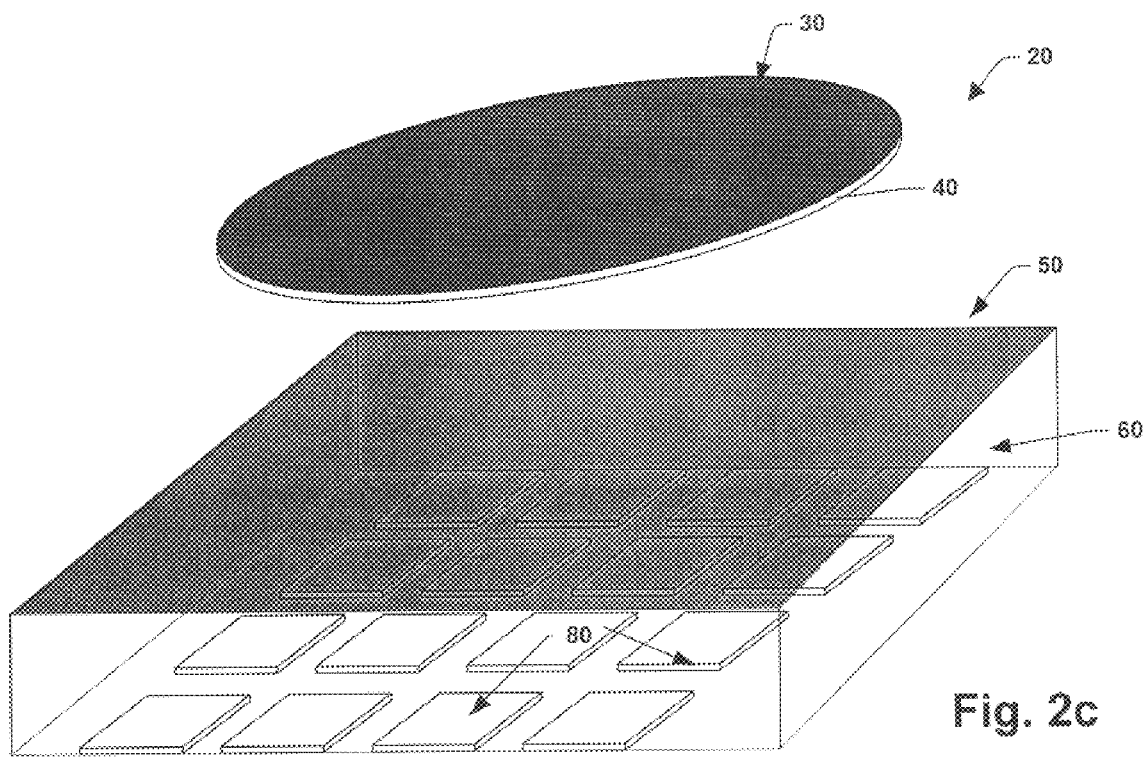
FIG. 2c is an exploded perspective illustration of a photoresist heating system in accordance with the present invention.

In one aspect of the invention as illustrated in FIG. 2a, the bakeplate 70 supports the shell 50 containing the heat transfer fluid 60. The shell 50 supports the substrate 40 having substantially wet photoresist 30 thereon. After the photoresist 30 is dried, suitable photolithographic techniques may be performed to pattern the substrate 40 in a desired manner. The top side of the bakeplate 70 supports the shell 50 as illustrated in FIG. 2a, and the bottom side of the bakeplate 70 includes a plurality of heating elements 80 as illustrated in FIGS. 2a and 2b. The heating elements 80 are distributed across the bottom surface of the bakeplate 70 so as to provide uniform distribution of heat to the shell 50 residing on the bakeplate 70. In another aspect of the invention, the bakeplate 70 having heating elements 80, can be incorporated into the shell 50, or located within the shell 50 as illustrated in FIG. 2c. Any suitable heating elements (e.g., electric coils, ceramic heaters, heating plates, thermoelectric heaters, gas heaters) may be employed if appropriate to carry out the present invention and are intended to fall within the scope of the hereto appended claims. It is to be appreciated that the heating elements 80, can also be incorporated within the bakeplate 70, or that the bakeplate 70 itself can be one continuous heating element.

Figure 3C:
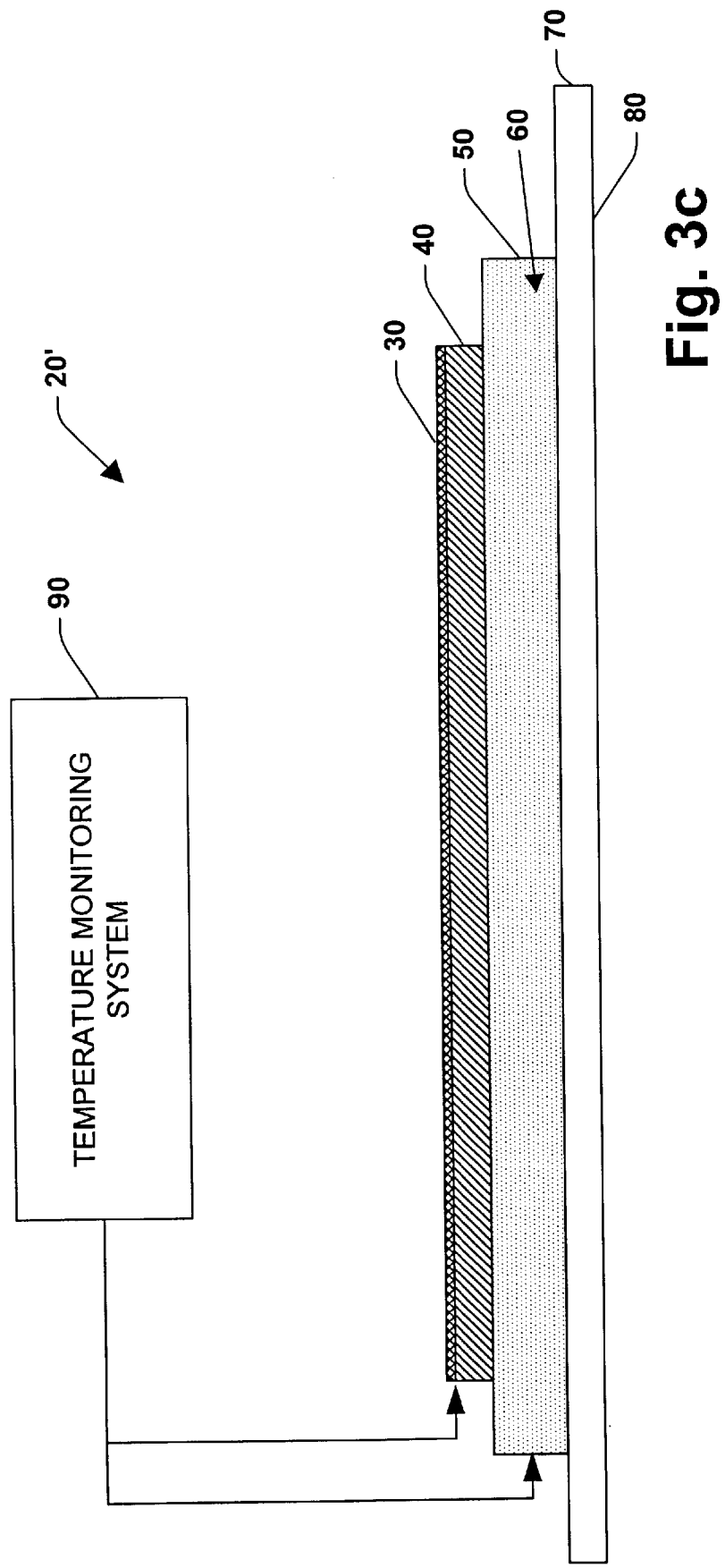
FIG. 3c is a schematic block diagram of the temperature monitoring system coupled to the photoresist layer and the heat transfer fluid in accordance with the present invention.
Figure 3D:
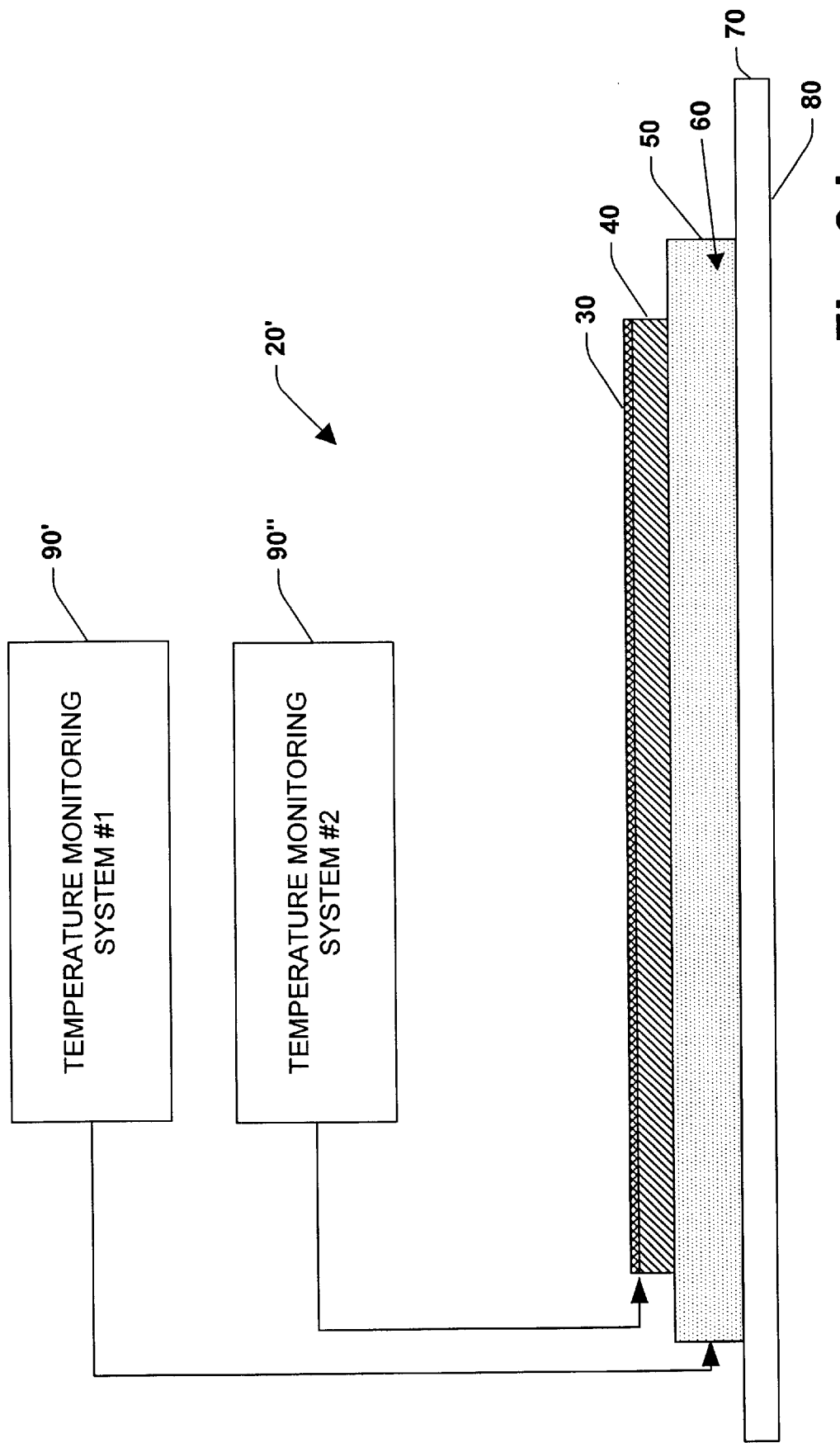
FIG. 3d is a schematic block diagram of two temperature monitoring systems in accordance with the present invention.

Turning now to FIGS. 3a–3e, a system 20' for facilitating uniform heating of photoresist 30 further includes a temperature monitoring system 90 is shown. The temperature monitoring system 90 provides temperature information during the above described heating process in order to facilitate uniform heating of the photoresist 30. The temperature monitoring system 90 can provide the temperature information of the heat transfer fluid 60 as illustrated in FIG. 3a. The temperature information can be employed to provide adjustment of the temperature of the photoresist 30. The temperature monitoring system 90 can provide the temperature information of the photoresist 30 as illustrated in FIG. 3b. The temperature monitoring system 90 can provide the temperature information of the photoresist 30 and the heat transfer fluid 60 as illustrated in FIG. 3c. Alternatively, two temperature monitoring systems 90' and 90" can provide temperature information of the photoresist 30 and the heat transfer fluid 60 separately as illustrated in FIG. 3d. The temperature monitoring system 90 can provide temperature information of the bake plate 70 or the heating elements 80 as illustrated in FIG. 3e. It is to be appreciated that the temperature monitoring system 90 can provide temperature information of the substrate 40, the shell 50 containing the heat transfer fluid 60, or any other suitable component of the system 20.

Figure 4A:
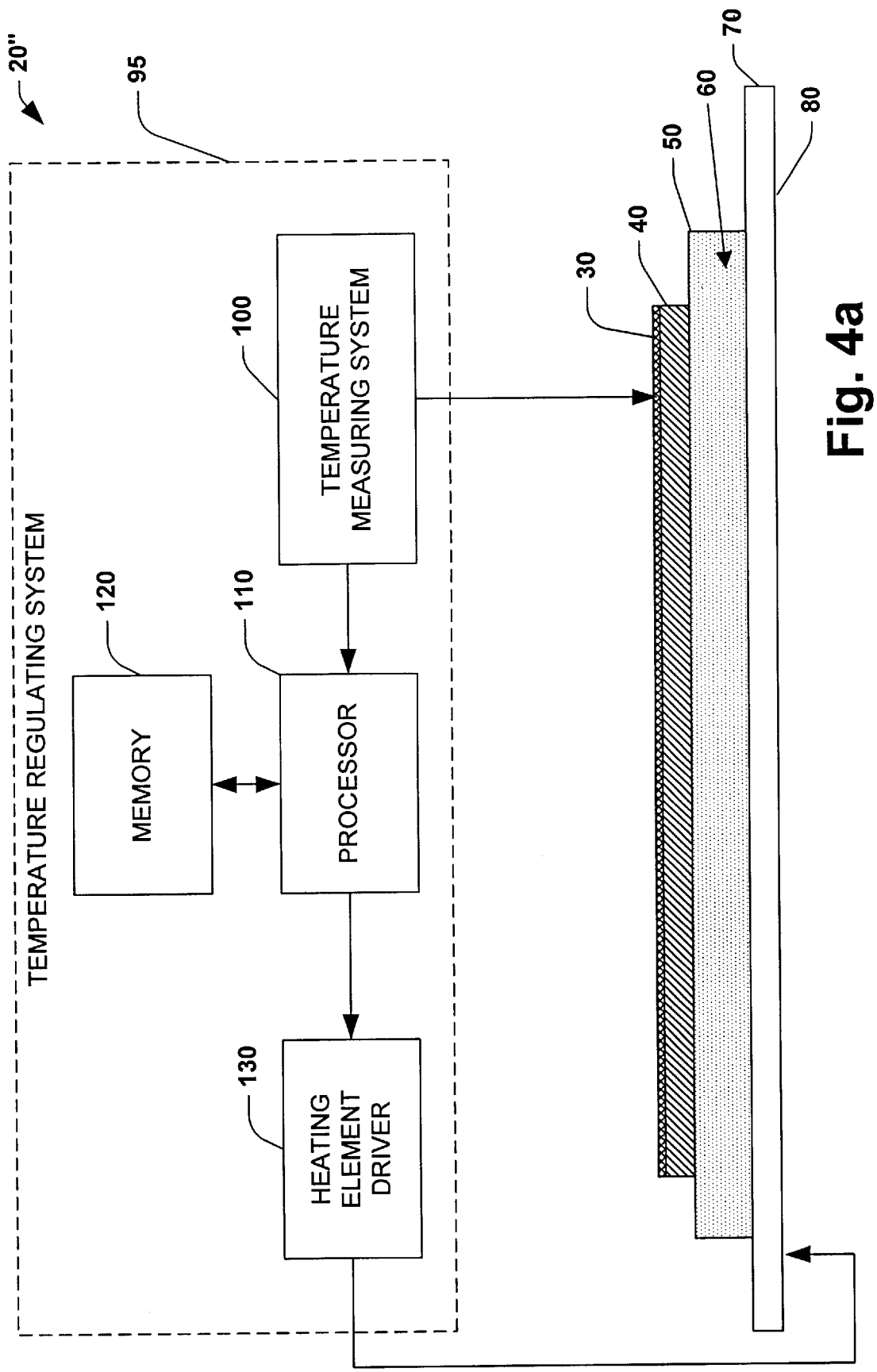
FIG. 4a is a schematic block diagram of a temperature regulating system in accordance with the present invention.
Figure 4B:
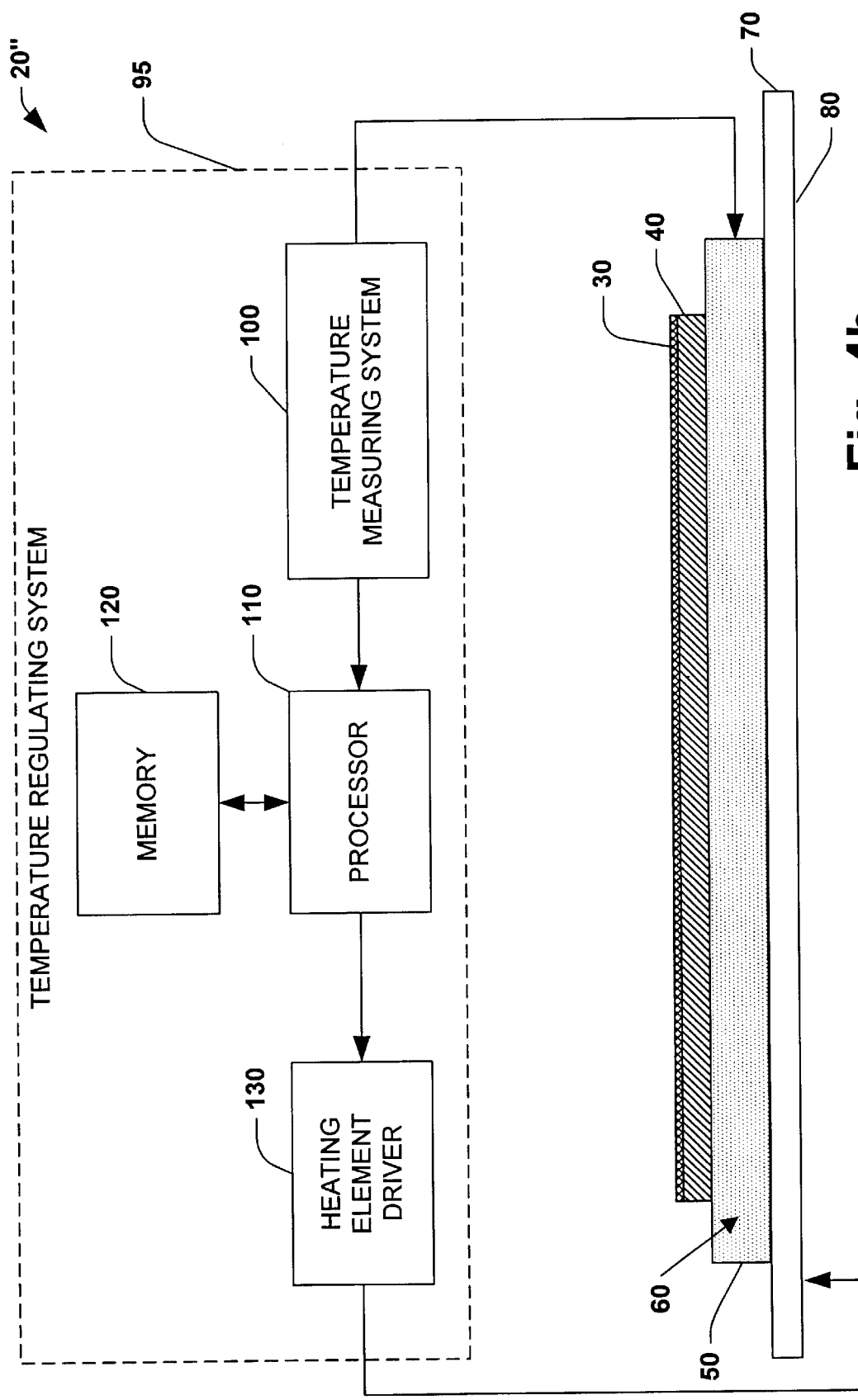
FIG. 4b is a schematic block diagram of the temperature regulating system coupled to the bake plate and the heat transfer fluid in accordance with the present invention.
Figure 4C:
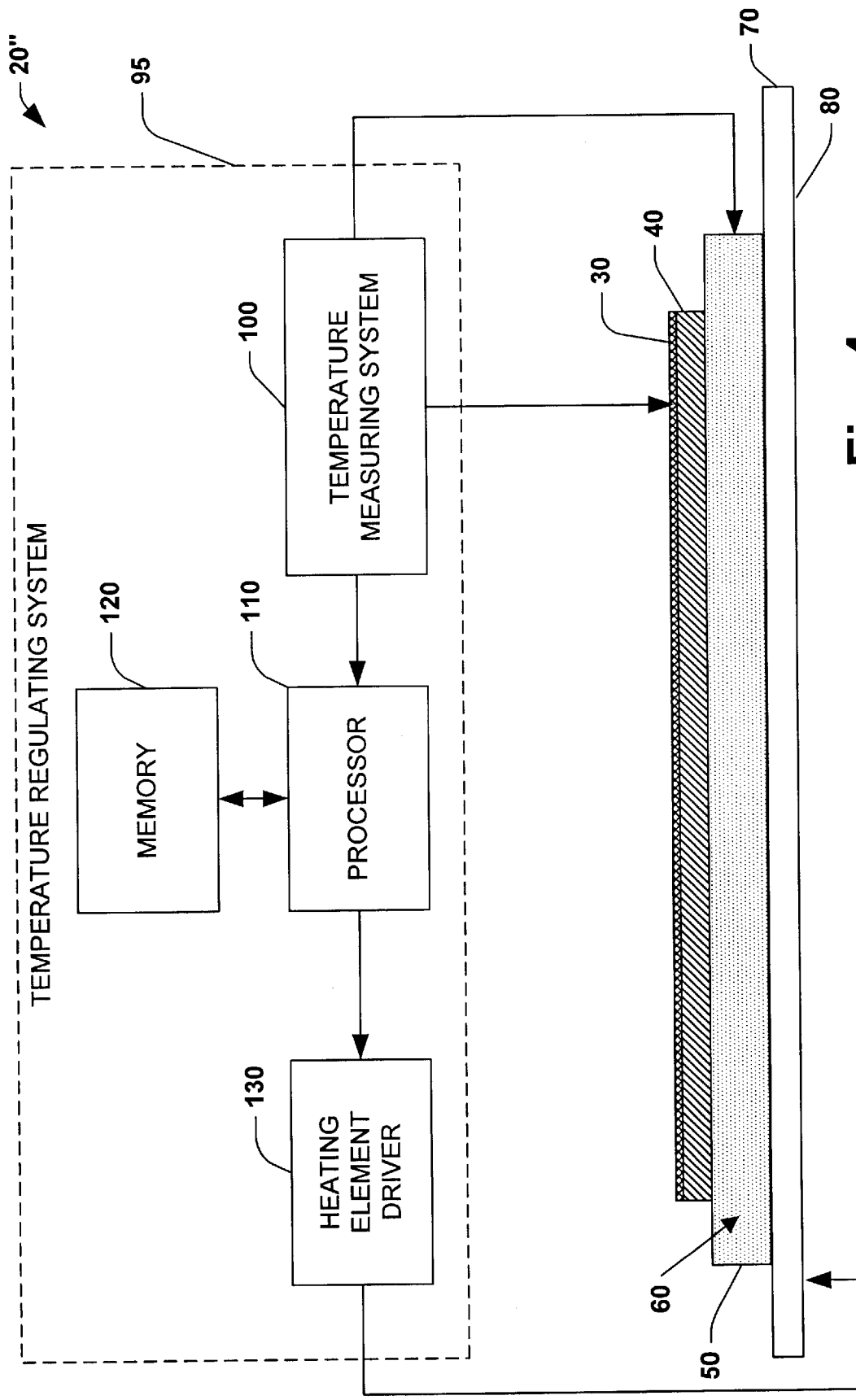
FIG. 4c is a schematic block diagram of the temperature regulating system coupled to the bake plate, the photoresist layer in accordance with the present invention.

Turning now to FIGS. 4a–4c, another aspect of a system 20" for facilitating uniform heating of the photoresist 30 is illustrated. In FIG. 4a, a temperature regulating system 95 can further include a temperature measuring system 100, a processor 110, a memory 120, and a heating element driver 130. The temperature measuring system 100 can be any system suitable for measuring temperatures, and will generally include a temperature sensor. It is to be appreciated that the temperature sensor chosen will depend on the particular material being heated, and the desired range of heating temperatures.

Figure 4D:
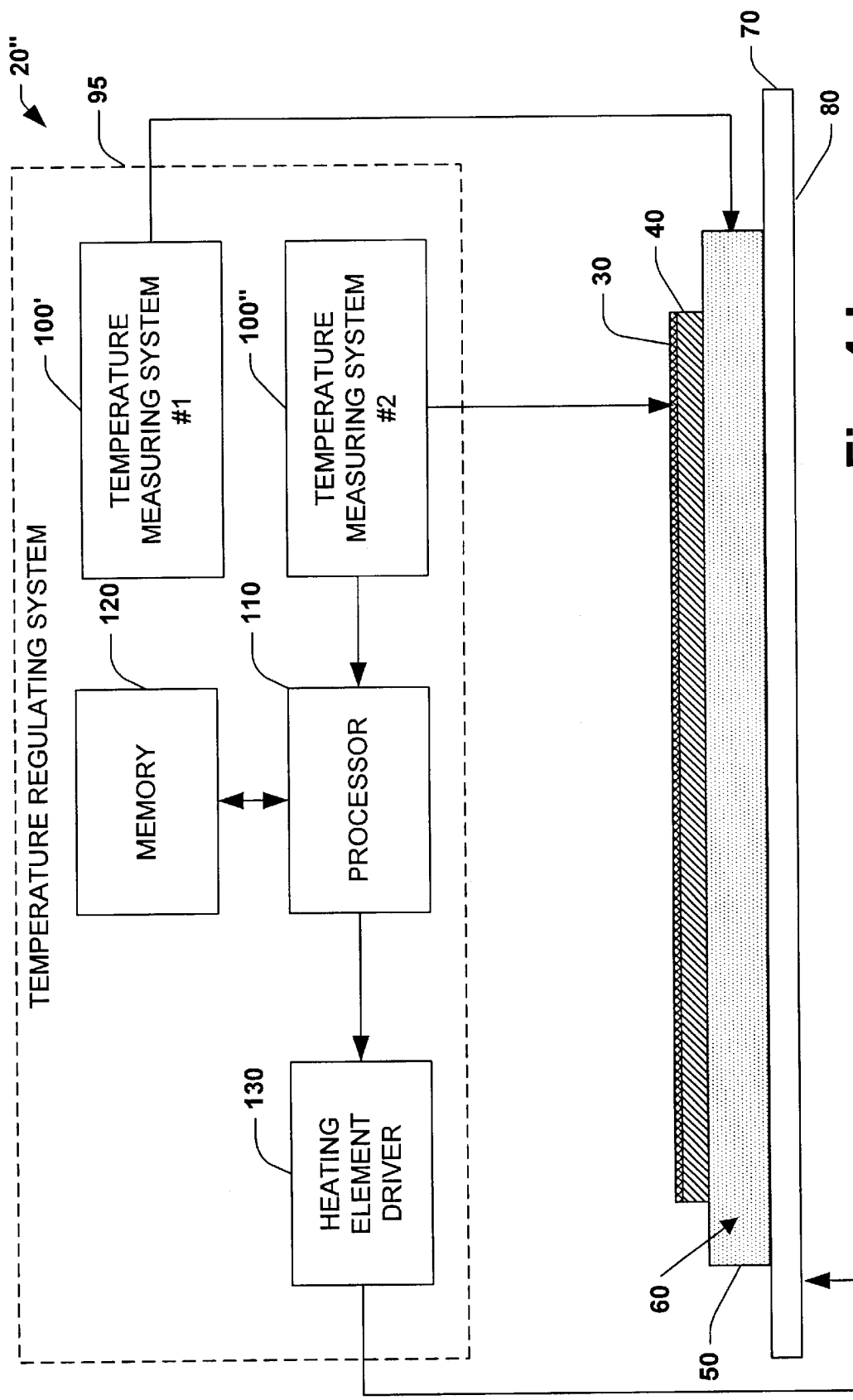
FIG. 4d is a schematic block diagram of the temperature regulating system including two temperature measuring systems in accordance with the present invention.

The temperature measuring system 100 measures the temperature of the photoresist 30 during the above described heating process in order to facilitate uniform heating of the photoresist 30. The temperature measuring system 100 can measure the temperature of the heat transfer fluid 60 as illustrated in FIG. 4b, or the temperature of the photoresist 30 and the heat transfer fluid 60 as illustrated in FIG. 4c. Alternatively, two temperature measuring systems 100' and 100" can measure the temperature of the photoresist 30 and the heat transfer fluid 60 separately as illustrated in FIG. 4d. It is to be appreciated that the temperature measuring system 100 can measure the temperature of the substrate 40, the shell 50 containing the heat transfer fluid 60, or any other suitable component of the system 20.

In FIG. 4a, the processor 110 receives the measured data from the temperature measuring system 100 and determines the temperature of the photoresist 30. Similarly, in FIG. 4b, the processor 110 receives the measured data from the temperature measuring system 100 and determines the temperature of the heat transfer fluid 60, and the processor 110 receives the measured data from the temperature measuring system 100 and determines both the photoresist 30 and the heat transfer fluid 60 in FIG. 4c. In FIG. 4d, the processor 110 receives measured data from two temperature measuring systems 100' and 100" separately, and determines the temperature of both the photoresist 30 and the heat transfer fluid 60.

The processor 110 is operatively coupled to the temperature measuring system 100 and is programmed to control and operate the various components within the photoresist heating system 20" in order to carry out the various functions described herein. The processor 110 can be coupled to a heating element driver 130, which drives the heat elements 80. The heating element driver 130 can be controlled by the processor 110 so as to selectively vary heat output of various heating elements 80. The processor (or CPU) 110 may be any of a plurality of processors, such as the AMD K7 and other similar and compatible processors. The manner in which the processor 110 can be programmed to carry out the functions relating to the present invention will be readily apparent to those having ordinary skill in the art based on the description provided herein.

A memory 120, which is operatively coupled to the processor 110, is also included in the system 20" and serves to store program code executed by the processor 110 for carrying out operating functions of the system 20" as described herein. The memory 120 includes read only memory (ROM) and random access memory (RAM). The ROM contains among other code the Basic Input-Output System (BIOS) which controls the basic hardware operations of the system 20". The RAM is the main memory into which the operating system and application programs are loaded. The memory 120 also serves as a storage medium for temporarily storing information such as photoresist temperature, heat transfer fluid temperature, acceptable temperature tables, and other data which may be employed in carrying out the present invention. For mass data storage, the memory 120 may include a hard disk drive (e.g., 10 Gigabyte hard drive). A power supply (not shown) can be utilized to provide operating power to the system 20". Any suitable power supply (e.g., battery, line power) may be employed to carry out the present invention.

It is to be appreciated that although FIGS. 1–4d are described herein with respect to heating the photoresist 30, these same figures may be used to represent heating of any other suitable material (e.g., top and bottom anti-reflective coatings, low K dielectric materials, spin-on-glass (SOG) and other spin-on materials) and those figures may be schematically referenced by numeral 30 of these figures.

Figure 5A:
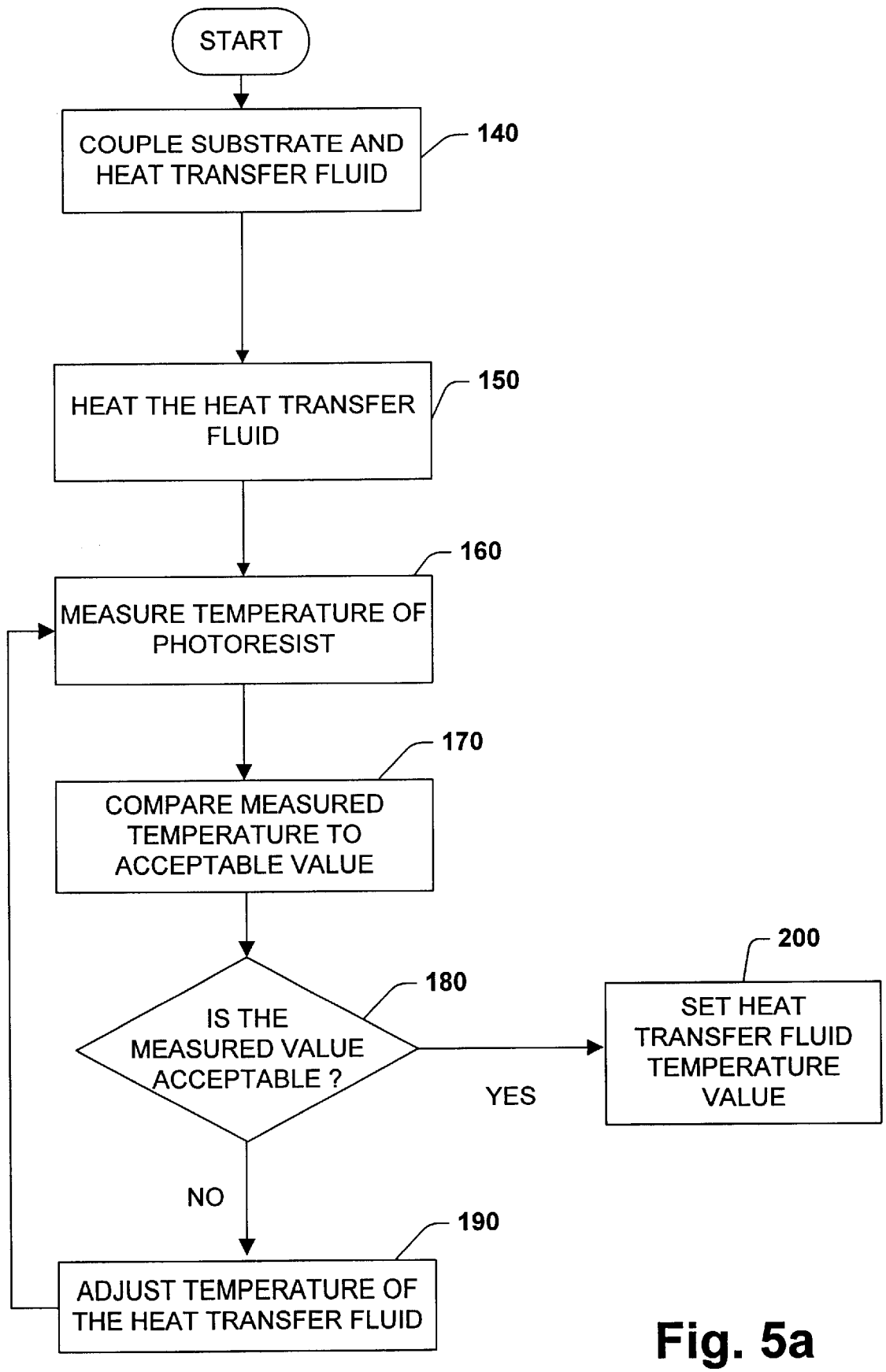
FIG. 5a is a flow diagram illustrating one specific methodology for carrying out the present invention.

FIG. 5a is a flow diagram illustrating one particular methodology for carrying out the present invention. In step 140, the substrate 40 is coupled to the heat transfer fluid 60, for instance by coupling the substrate 40 with photoresist 30 thereon to a shell 50 containing the heat transfer fluid 60. In step 150, the heat transfer fluid 60 is heated, for instance by a bakeplate 70 having heating elements 80. In step 160, the temperature of the photoresist 30 is measured. In step 170, the measured temperature of the photoresist 30 can then be compared to an acceptable value, or an acceptable value range. In step 180, if the measured temperature is not an acceptable value, or not within an acceptable value range (NO), step 190 is then performed, and the temperature of the heat transfer fluid 60 is adjusted in step 160. The heat transfer fluid 60 can be adjusted, for instance, by adjusting the temperature of the heating elements 80. Step 160 is then repeated and the temperature of the photoresist 30 is measured. In step 180, if the measured temperature is an acceptable value, or within an acceptable value range, step 200 is performed and the temperature values of is set.

Figure 5B:
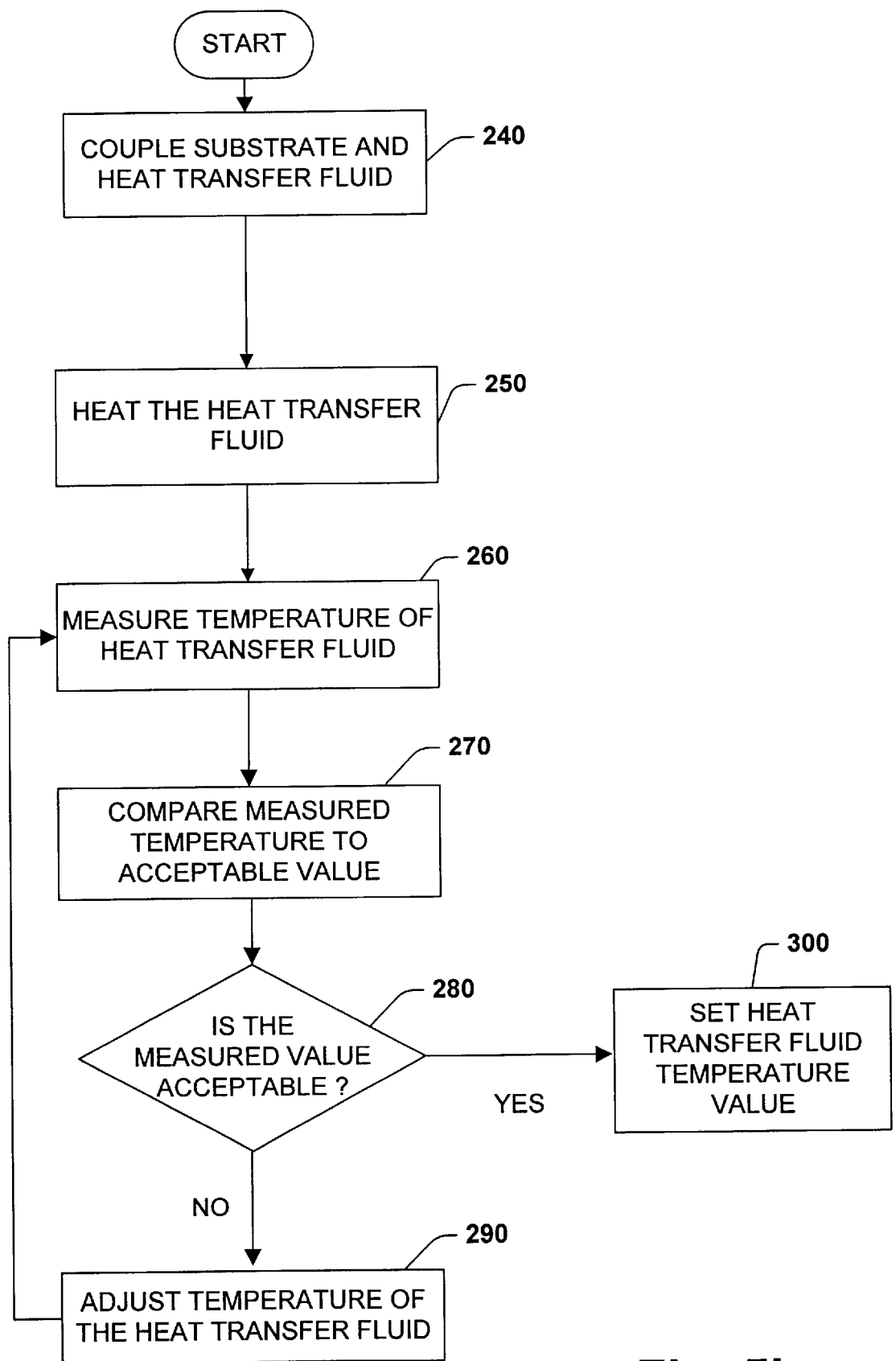
FIG. 5b is a flow diagram illustrating another specific methodology for carrying out the present invention.

FIG. 5b is a flow diagram illustrating another particular methodology for carrying out the present invention. In step 240, the substrate 40 is coupled to the heat transfer fluid 60, for instance by coupling the substrate 40 with photoresist 30 thereon to a shell 50 containing the heat transfer fluid 60. In step 250, the heat transfer fluid 60 is heated, for instance by a bakeplate 70 having heating elements 80. In step 260, the temperature of the heat transfer fluid 60 is measured. In step 270, the measured temperature of the heat transfer fluid 60 can then be compared to an acceptable value, or an acceptable value range. In step 280, if the measured temperature is not an acceptable value, or not within an acceptable value range (NO), step 290 is then performed, and the temperature of the heat transfer fluid 60 is adjusted in step 260. The heat transfer fluid 60 can be adjusted, for instance, by adjusting the temperature of the heating elements 80. Step 260 is then repeated and the temperature of the heat transfer fluid 60 is measured. In step 280, if the measured temperature is an acceptable value, or within an acceptable value range, step 300 is performed and the temperature value of the heat transfer fluid is set.

Figure 5C:
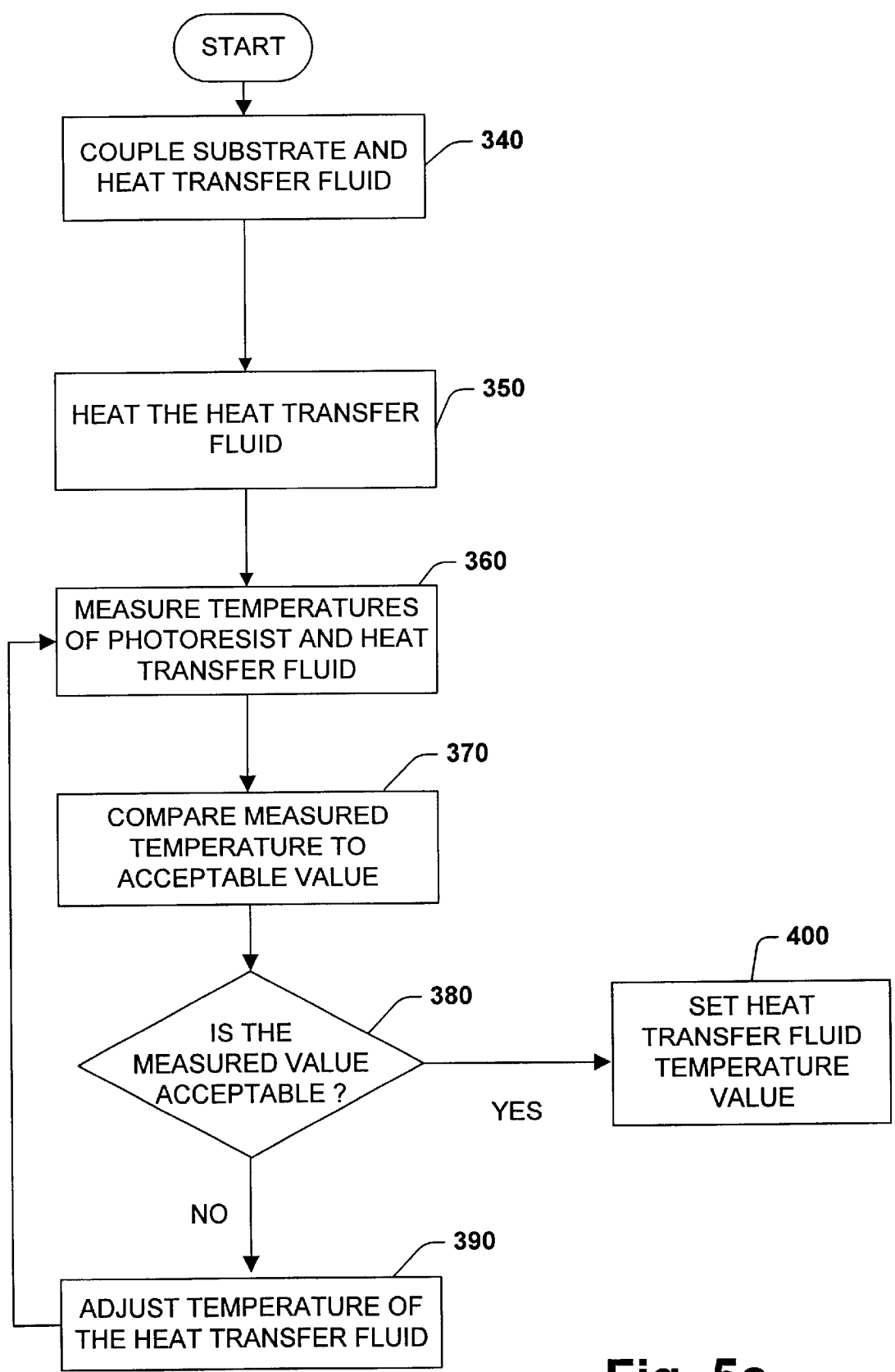
FIG. 5c is a flow diagram illustrating yet another specific methodology for carrying out the present invention.

FIG. 5c is a flow diagram illustrating one particular methodology for carrying out the present invention. In step 340, the substrate 40 is coupled to the heat transfer fluid 60, for instance by coupling the substrate 40 with photoresist 30 thereon to a shell 50 containing the heat transfer fluid 60. In step 350, the heat transfer fluid 60 is heated, for instance by a bakeplate 70 having heating elements 80. In step 360, the temperatures of the photoresist 30 and the heat transfer fluid 60 are measured. In step 370, the measured temperature of the photoresist 30 can then be compared to an acceptable value, or an acceptable value range. In step 380, if the measured temperature is not an acceptable value, or not within an acceptable value range (NO), step 390 is then performed, and the temperature of the heat transfer fluid 60 is adjusted in step 360. The heat transfer fluid 60 can be adjusted, for instance, by adjusting the temperature of the heating elements 80. Step 360 is then repeated and the temperatures of the photoresist 30 and the heat transfer fluid 60 are measured. In step 380, if the measured temperature is an acceptable value, or within an acceptable value range, step 400 is performed and the temperature value of the heat transfer fluid is set.

The present invention provides for a system and method for heating a photoresist in a substantially uniform manner. As a result, the present invention facilitates improving photoresist integrity and reliability which in turn afford for increases in quality of image transfer in lithographic processes employing a photoresist heated in accordance with the present invention.

What has been described above are preferred embodiments of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims.

What is claimed is:

1. A system for facilitating uniform photoresist heating temperature, comprising:
    at least one heating element operative to heat a heat transfer fluid, the heat transfer fluid coupled to a substrate so as to heat a photoresist thereon.

2. The system of claim 1, wherein the heat transfer fluid is a liquid.

3. The system of claim 1, wherein the heat transfer fluid is a gas.

4. The system of claim 1, further including a shell for containing the heat transfer fluid.

5. The system of claim 4, wherein the at least one heating element is coupled to the shell and the shell is coupled to the substrate.

6. The system of claim 5, wherein the at least one heating element is inside the shell.

7. The system of claim 1, wherein the at least one heating element is a fluid heating system outside the shell and fluid is provided to the shell through a distribution line.

8. The system of claim 1, further including at least one temperature monitoring system for providing temperature information on the photoresist.

9. The system of claim 1, further including at least one temperature monitoring system for providing temperature information on the heat transfer fluid.

10. The system of claim 1, further including at least one temperature monitoring system for providing temperature information on the photoresist and the heat transfer fluid.

11. The system of claim 1, further including a first temperature monitoring system for providing temperature information on the photoresist and a second temperature monitoring system for providing temperature information the heat transfer fluid.

12. The system of claim 1, further including a temperature regulating system for regulating the temperature of the photoresist.

13. The system of claim 12, wherein the temperature regulating system regulates the temperature of the heat transfer fluid based on temperature measurements made by a temperature measurement system.

14. The system of claim 13, the temperature measurement system measuring the temperature of the photoresist.

15. The system of claim 13, the temperature measurement system measuring the temperature of the heat transfer fluid.

16. The system of claim 13, the temperature measurement system measuring the temperature of the photoresist and the heat transfer fluid.

17. The system of claim 13, wherein the temperature regulating system includes at least one processor operatively coupled to the at least one heating element, the processor receiving temperature data from the temperature measuring system, and the processor using the data to regulate the temperature of the at least one heating element.

18. A system for facilitating uniform heating temperature of a photoresist covering a substrate, comprising:
  a plate for supporting the substrate, the plate including:
    a surface for engaging a shell containing a heat transfer fluid,
    at least one heating element operatively coupled to the plate for regulating temperature of at least portions of the photoresist, respectively, via heat conduction through the plate, shell, and substrate; and
  a temperature regulating system for regulating temperature of at least a portion of the photoresist, the temperature regulating system including
    a temperature measuring system; and
    a processor operatively coupled to the temperature measuring system and the at least one heating element.

19. The system of claim 18, further including a memory storing acceptable temperature values for the photoresist.

20. The system of claim 18, wherein the processor controls at least one heating element to regulate the temperature of the photoresist.

21. The system of claim 20, wherein the processor controls at least one heating element via a heating element driver to regulate the temperature of the photoresist.

22. The system of claim 18, wherein the processor controls at least one heating element to regulate the temperature of the heat transfer fluid.

23. A method for facilitating uniform photoresist heating temperature, comprising:

heating a heat transfer fluid to a temperature using at least one heating element; and coupling a substrate with the heat transfer fluid so as to heat a photoresist thereon to a temperature.

24. The method of claim 23, wherein the heat transfer fluid is a liquid.

25. The method of claim 23, wherein the heat transfer fluid is a gas.

26. The method of claim 23, wherein the heat transfer fluid is contained in a shell and the shell is coupled to the substrate.

27. The method of claim 26, wherein the heat transfer fluid is heated by at least one heating element coupled to the shell.

28. The method of claim 27, wherein the at least one heating element is inside the shell.

29. The method of claim 28, further comprising regulating the temperature of the at least one heating element.

30. The method of claim 23, further comprising regulating the temperature of the photoresist.

31. The method of claim 23, further comprising regulating the temperature of the heat transfer fluid.

32. The method of claim 23, further comprising monitoring the temperature of the heat transfer fluid and monitoring the temperature of the photoresist.

33. A system for facilitating uniform heating of a photoresist, comprising:
  means for heating a heat transfer fluid to a temperature; and
  means for coupling the heat transfer fluid to a substrate so as to heat a photoresist thereon to a temperature.

34. The system of claim 33, further including means for regulating the temperature of the photoresist.

35. The system of claim 33, further including means for regulating the temperature of the heat transfer fluid.

36. The system of claim 33, further including means for monitoring the temperature of the photoresist.

37. A system for facilitating uniform heating temperature of a material, comprising:
  at least one heating element operative to heat a heat transfer fluid, the heat transfer fluid coupled to the material.

38. The system of claim 37, the material being a top anti-reflective coating.

39. The system of claim 37, the material being a bottom anti-reflective coating.

40. The system of claim 37, the material being a low K dielectric material.

41. The system of claim 37, the material being spin on glass.

42. The system of claim 37, the material being a spin-on material.

* * * * *